US011755943B2

(12) United States Patent
Maslov et al.

(10) Patent No.: US 11,755,943 B2
(45) Date of Patent: Sep. 12, 2023

(54) RANDOMIZED BENCHMARKING BY EXPLOITING THE STRUCTURE OF THE CLIFFORD GROUP

(71) Applicant: International Business Machines Corporation, Armonk, NY (US)

(72) Inventors: Dmitri Maslov, New Canaan, CT (US); Sergey Bravyi, Yorktown Heights, NY (US); Jay Michael Gambetta, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 18/153,786

(22) Filed: Jan. 12, 2023

(65) Prior Publication Data

US 2023/0153670 A1  May 18, 2023

Related U.S. Application Data

(63) Continuation of application No. 16/872,962, filed on May 12, 2020, now Pat. No. 11,556,832.

(51) Int. Cl.
*G06N 10/00* (2022.01)
*H03K 19/20* (2006.01)
(Continued)

(52) U.S. Cl.
CPC ............ *G06N 10/00* (2019.01); *G06N 10/20* (2022.01); *H03K 19/195* (2013.01); *H03K 19/20* (2013.01)

(58) Field of Classification Search
CPC ...... G06N 10/00; G06N 10/20; H03K 19/195; H03K 19/20
See application file for complete search history.

(56) References Cited

U.S. PATENT DOCUMENTS 10,469,087 B1  11/2019  Granade et al.
10,483,980 B2  11/2019  Sete et al.
(Continued)

FOREIGN PATENT DOCUMENTS

WO    2019/078907 A1    4/2019

OTHER PUBLICATIONS

Non Final Office Action received for U.S. Appl. No. 16/872,962 dated May 13, 2022, 10 pages.
(Continued)

*Primary Examiner* — Kurtis R Bahr
(74) *Attorney, Agent, or Firm* — Amin, Turocy & Watson, LLP

(57) ABSTRACT

A method of generating a randomized benchmarking protocol includes providing a randomly generated plurality of Hadamard gates; applying the Hadamard gates to a plurality of qubits; and generating randomly a plurality of Hadamard-free Clifford circuits. Each of the plurality of Hadamard-free Clifford circuits is generated by at least randomly generating a uniformly distributed phase (P) gate, and randomly generating a uniformly distributed linear Boolean invertible matrix of conditional NOT (CNOT) gate, and combining the P and CNOT gates to form each of the plurality of Hadamard-free Clifford circuits. The method also includes combining each of the plurality of Hadamard-free Clifford circuits with corresponding each of the plurality of Hadamard gates to form a sequence of alternating Hadamard-free Clifford-Hadamard pairs circuit to form the randomized benchmarking protocol; and measuring noise in a quantum mechanical processor using the randomized benchmarking protocol.

20 Claims, 2 Drawing Sheets

(51) Int. Cl.
*H03K 19/195* (2006.01)
*G06N 10/20* (2022.01)

(56) References Cited

U.S. PATENT DOCUMENTS

| | | | |
|---|---|---|---|
| 11,200,360 B1* | 12/2021 | Bravyi | G06F 30/28 |
| 11,244,240 B2* | 2/2022 | Martinis | G06N 10/00 |
| 2017/0220948 A1 | 8/2017 | Bocharov et al. | |
| 2019/0026211 A1 | 1/2019 | Wallman et al. | |
| 2019/0121921 A1 | 4/2019 | Nam et al. | |
| 2019/0156239 A1 | 5/2019 | Martinis et al. | |
| 2021/0287125 A1* | 9/2021 | Maslov | G06N 10/00 |
| 2021/0365824 A1* | 11/2021 | Maslov | G06N 10/20 |

OTHER PUBLICATIONS

Dana Randall "Efficient Generation of Random Nonsingular Matrices", Wiley online library: vol. 4, Issue 1, 1993, pp. 111-118.

Magesan et al., "Characterizing quantum gates via randomized benchmarking", Cornell University Quantum Physics arXiv:1109.6887v2, Apr. 27, 2012.

Koenig et al., "How to efficiently select an arbitrary Clifford group element", J. Math. Phys. 55, 122202 (2014); https://doi.org/10.1063/1.4903507.

Kliuchnikov et al., "Optimization of Clifford circuits", Physical Review A 88, 052307 (2013).

Mckay et al., "Three-Qubit Randomized Benchmarking", Physical Review Letters 122, 200502 (2019).

Knill et al., "Randomized benchmarking of quantum gates", Physical Review A 77, 012307, 2008.

Maslov et al., "Shorter stabilizer circuits via Bruhat decomposition and quantum circuit transformations", IEEE Transactions on Information Theory, vol. 64, No. 7, Jul. 2018.

Notice of Allowance received for U.S. Appl. No. 16/872,962 dated Aug. 30, 2022, 23 pages.

List of IBM Patents or Applications Treated as Related.

* cited by examiner

RANDOMIZED BENCHMARKING BY EXPLOITING THE STRUCTURE OF THE CLIFFORD GROUP

BACKGROUND

The currently claimed embodiments of the present invention relate to quantum computation, and more specifically, to methods of generating a randomized benchmarking protocol.

Clifford circuits can be used in quantum computing for quantum error correction and in fault-tolerant computations. Optimization of Clifford circuits can be useful within the scope of fault-tolerant computations, as the Clifford overhead can dominate the cost of an implementation, despite the cost of the non-Clifford gates being higher than that of the Clifford gates. Clifford circuits can also be used in the study of entanglement and in the study of noise in quantum computers via randomized benchmarking (RB). Random uniformly distributed Clifford circuits have many applications in quantum computing including in randomized benchmarking protocols, randomized quantum code construction, quantum data hiding, and in compressed classical description of quantum states.

Randomized benchmarking) is an efficient and robust method to characterize gate errors in quantum mechanical circuits. Averaging over random sequences of gates can provide estimates of gate errors in terms of the average circuit fidelity. These estimates are independent from the state preparation and measurement errors that plague other methods such as channel tomography and direct fidelity estimation. Standard RB protocols consist of repeated application of a sequence of k random n-qubit Clifford circuits, C1C2 . . . Ck, followed by Ck+1 that performs the inversion of the unitary transformation obtained by the circuit C1 . . . Ck and measuring the result.

SUMMARY

An aspect of the present invention is to provide a method of generating a randomized benchmarking protocol. The method includes providing a randomly generated plurality of Hadamard gates; and applying the Hadamard gates to a plurality of qubits; and generating randomly a plurality of Hadamard-free Clifford circuits. Each of the plurality of Hadamard-free Clifford circuits is generated by at least randomly generating a uniformly distributed phase (P) gate, and randomly generating a uniformly distributed linear Boolean invertible matrix of conditional NOT (CNOT) gate, and combining the P and CNOT gates to form each of the plurality of Hadamard-free Clifford circuits. The method further includes combining each of the generated plurality of Hadamard-free Clifford circuits with corresponding each of the randomly generated plurality of Hadamard gates to form a sequence of alternating Hadamard-free Clifford-Hadamard pairs circuit to form the randomized benchmarking protocol; and measuring noise in a quantum mechanical processor using the randomized benchmarking protocol.

In an embodiment, generating randomly the plurality of Hadamard gates includes generating the plurality of Hadamard gates $H_1 \ldots _k$, where k is an integer greater than 2 and corresponds to a number of random qubits sampled from n-qubits, n being greater than or equal to 2.

In an embodiment, generating randomly the plurality of Hadamard-free Clifford circuits includes generating the plurality of Hadamard-free Clifford circuits $F_1 \ldots _k$, where k is an integer greater than 2 and corresponds to a number of random qubits sampled from n-qubits, n being greater than or equal to 2.

In an embodiment, combining each of the generated plurality of Hadamard-free Clifford circuits with corresponding each of the randomly generated plurality of Hadamard gates to form the sequence of alternating Hadamard-free Clifford-Hadamard pairs circuit includes forming the sequence $F_1 H_1 \ldots F_k H_k F_{k+1} H_{k+1}$, where k is an integer. In an embodiment, the plurality of Hadamard-free Clifford circuits are different from each other and are chosen at random according to a specified distribution.

In an embodiment, generating each of the plurality of Hadamard-free Clifford circuits includes randomly generating the uniformly distributed phase (P) gate, randomly generating the uniformly distributed linear Boolean invertible matrix of conditional NOT (CNOT) gate, and randomly generating a uniformly distributed conditional rotation around axis-Z (CZ) gate, and combining the P, CZ, and CNOT gates to form each of the plurality of Hadamard-free Clifford circuits.

In an embodiment, combining each of the generated plurality of Hadamard-free Clifford circuits with corresponding each of the randomly generated plurality of Hadamard gates to form a sequence of Hadamard-free Clifford-Hadamard pairs circuit includes forming the sequence $F_1 H_1 \ldots F_k H_k F_{k+1} H_{k+1}$, where k is an integer, wherein: the Hadamard-free Clifford circuits $F_1, F_2, \ldots F_k$ are equal to a product P·CZ·CNOT, where P is a uniformly distributed phase (P) gate, CZ is a uniformly distributed conditional rotation around axis-Z (CZ) gate, and CNOT is a uniformly distributed linear Boolean conditional NOT (CNOT) circuit, and the Hadamard-free Clifford circuit $F_{k+1}$ is reduced to contain no more than nk−k(k+1)/2 two-qubit CNOT and CZ gates, where k is the number of Hadamard gates in Bruhat expansion of $F_1 H_1 \ldots F_k H_k$, where nk−k(k+1)/2 is obtained by reducing a left-hand Hadamard-free element by commuting and merging gates in it to the right.

In an embodiment, a computational complexity of generating the randomized benchmarking protocol grows quadratically with a number of qubits. In an embodiment, measuring the noise in the quantum mechanical circuit includes combining an additional Hadamard-free Clifford-Hadamard pair to the formed sequence of Hadamard-free Clifford-Hadamard pairs circuit to perform an inversion of a unitary transformation obtained by the formed sequence of Hadamard-free Clifford-Hadamard pairs circuit.

In an embodiment, the method further includes optimizing a length of the randomized benchmarking protocol by using fewer gates in the plurality of Hadamard-free Clifford circuits than a number of circuit elements in a full Clifford circuit. In an embodiment, a size of the plurality of Hadamard-free Clifford circuits are computed using the following equation:

$$|\mathcal{F}(n)| = 2^{2n+n^2} \prod_{j=1}^{n}(2^j - 1)$$

and the number of circuit elements in the full Clifford circuit is computed using the following equation:

$$|C(n)| = 2^{2n+n^2} \prod_{j=1}^{n}(4^j - 1)$$

where n is a number of qubits, j is an independent variable and j is an increment from 1 to n number of qubits.

Another aspect of the present invention is to provide a computer readable medium on which is stored non-transitory computer-executable code, which when executed by a classical computer causes a quantum computer to: (a) provide a randomly generated plurality of Hadamard gates; (b) apply the randomly generated Hadamard gates to a plurality of qubits; (c) generate randomly a plurality of Hadamard-free Clifford circuits, wherein each of the plurality of Hadamard-free Clifford circuits is generated by at least randomly generating a uniformly distributed phase (P) gates, and randomly generating a uniformly distributed linear Boolean invertible matrix of conditional NOT (CNOT) gates, and combining the P and CNOT gates to form each of the plurality of Hadamard-free Clifford circuits; (d) combine each of the generated plurality of Hadamard-free Clifford circuits with corresponding each of the randomly generated plurality of Hadamard gates to form a sequence of alternating Hadamard-free Clifford-Hadamard pairs circuit to form the randomized benchmarking protocol; and (e) measure noise in a quantum mechanical processor using the randomized benchmarking protocol.

In an embodiment, the non-transitory computer-executable code when executed by the classical computer causes the quantum computer to generate the plurality of Hadamard gates $H_{1...k}$, where k is an integer greater than 2 and corresponds to a number of random qubits sampled from n-qubits, n being greater than or equal to 2.

In an embodiment, the non-transitory computer-executable code when executed by the classical computer causes the quantum computer to generate the plurality of Hadamard-free Clifford circuits $F_{1...k}$, where k is an integer greater than 2 and corresponds to a number of random qubits sampled from n-qubits, n being greater than or equal to 2.

In an embodiment, the non-transitory computer-executable code when executed by the classical computer causes the quantum computer to combine each of the generated plurality of Hadamard-free Clifford circuits with corresponding each of the randomly generated plurality of Hadamard gates to form the sequence $F_1H_1 \ldots F_kH_kF_{k+1}H_{k+1}$, where k is an integer. In an embodiment, the plurality of Hadamard-free Clifford circuits are different from each other and are chosen at random according to a specified distribution.

In an embodiment, the non-transitory computer-executable code when executed by the classical computer causes the quantum computer to apply the uniformly distributed phase (P) gates, apply the uniformly distributed random linear Boolean invertible matrix computed by conditional NOT (CNOT) gates, and apply a random uniformly distributed conditional rotation around axis-Z (CZ) gate, and combine the P, CZ, and CNOT gates to form each of the plurality of Hadamard-free Clifford circuits.

In an embodiment, the non-transitory computer-executable code when executed by the classical computer causes the quantum computer to optimize a length of the randomized benchmarking protocol by using fewer gates in the plurality of Hadamard-free Clifford circuits than a number of circuit elements in a full Clifford circuit.

In an embodiment, the number of elements of the plurality of Hadamard-free Clifford circuits are computed using the following equation:

$$|\mathcal{F}(n)| = 2^{2n+n^2}\prod_{j=1}^{n}(2^j - 1)$$

and the number of circuit elements in the full Clifford circuit is computed using the following equation:

$$|C(n)| = 2^{2n+n^2}\prod_{j=1}^{n}(4^j - 1)$$

where n is a number of qubits, j is an independent variable and j is an increment from 1 to n number of qubits.

Another aspect of the present invention is to provide a classical computer configured to execute a non-transitory computer-executable code, the code when executed by the classical computer causes a quantum computer to: (a) provide randomly a plurality of Hadamard gates; (b) apply the randomly generated Hadamard gates to a plurality of qubits; (c) generate randomly a plurality of Hadamard-free Clifford circuits, wherein each of the plurality of Hadamard-free Clifford circuits is generated by at least randomly generating a uniformly distributed phase (P) gate, and randomly generating a uniformly distributed linear Boolean invertible matrix of conditional NOT (CNOT) gate, and combining the P and CNOT gates to form each of the plurality of Hadamard-free Clifford circuits; (d) combine each of the generated plurality of Hadamard-free Clifford circuits with corresponding each of the randomly generated plurality of Hadamard gates to form a sequence of alternating Hadamard-free Clifford-Hadamard pairs circuit to form the randomized benchmarking protocol; and (e) measure noise in a quantum mechanical processor using the randomized benchmarking protocol.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

In the following paragraphs, the term "randomized benchmarking" or "randomized benchmarking protocol" (RB) is used broadly to refer to any method for assessing the capabilities of quantum computing hardware platforms including quantum processors through estimating the average error rates that are measured under the implementation of long sequences of random quantum gate operations. Randomized benchmarking protocols are used for verifying and validating quantum operations and can be used for the optimization of quantum control procedures. Randomized benchmarking is used to test the validity of quantum operations, which in turn is used to improve the functionality of the quantum computer hardware.

Other methods can be used for determining error rate in quantum computing hardware platforms. For example, another method for determining the error behavior of a gate implementation is to perform process tomography. However, standard process tomography is limited by errors in state preparation, measurement and one-qubit gates. Tomography suffers from inefficient scaling with number of qubits and does not detect adverse error-compounding when gates are composed in long sequences. An additional problem is that desirable error probabilities for scalable quantum computing are of the order of 0.0001 or lower. Experimentally proving such low errors is challenging. Therefore, Randomized benchmarking is often preferred to the tomography methods. A randomized benchmarking method can provide estimates of the computationally relevant errors or noise without relying on accurate state preparation and measurement. Randomized benchmarking involves long sequences of randomly chosen gates. As a result, randomized benchmarking can also be used to verify that error behavior or noise is stable when used in long computations.

Figure 1:
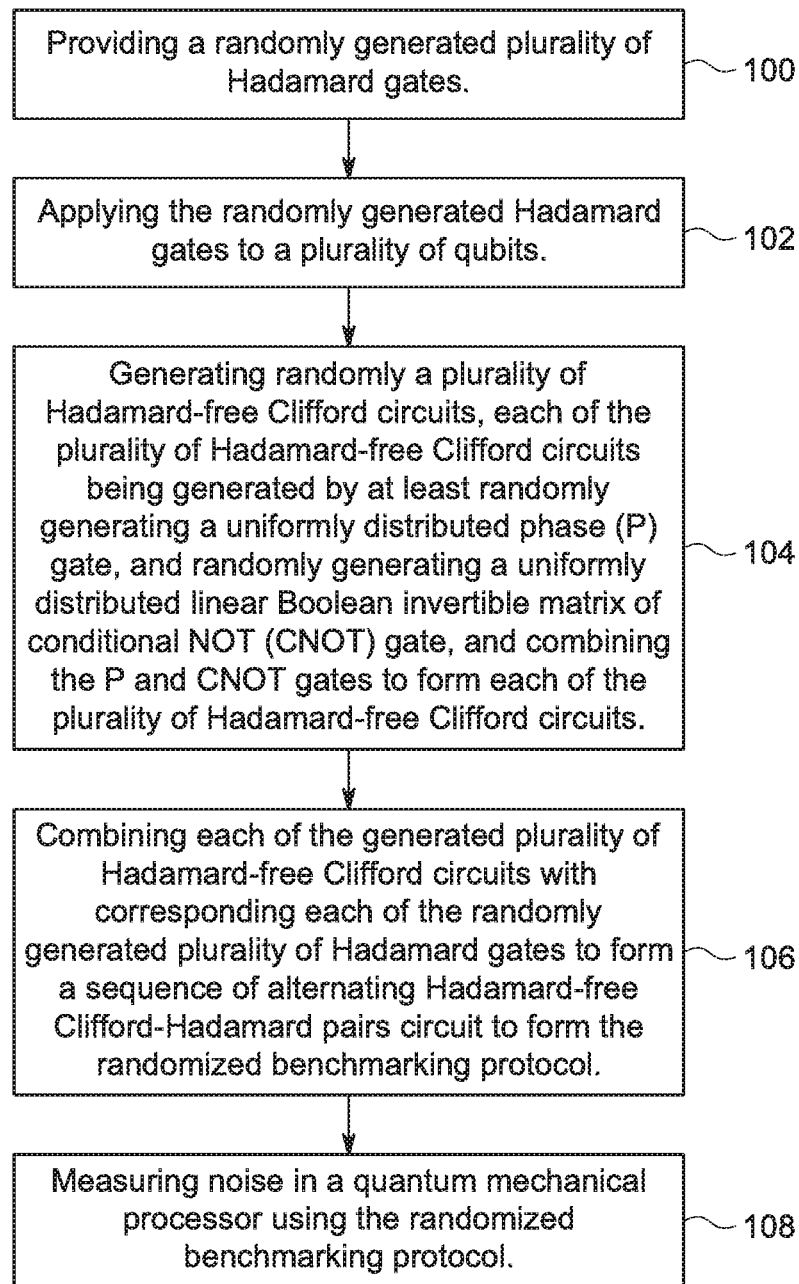
FIG. 1 is a flow chart of a method of generating a randomized benchmarking protocol, according to an embodiment of the present invention.

FIG. 1 is a flow chart of a method of generating a randomized benchmarking protocol, according to an embodiment of the present invention. The method includes providing a randomly generated plurality of Hadamard (H) gates, at 100, and applying the randomly generated Hadamard gates to a plurality of qubits, at 102. The method also includes generating randomly a plurality of Hadamard-free Clifford circuits, at 104. Each of the plurality of Hadamard-free Clifford circuits is generated by at least randomly generating a uniformly distributed phase (P) gate, and randomly generating a uniformly distributed linear Boolean invertible matrix of conditional NOT (CNOT) gate, and combining the P and CNOT gates to form each of the plurality of Hadamard-free Clifford circuits. The method further includes combining each of the generated plurality of Hadamard-free Clifford circuits with corresponding each of the randomly generated plurality of Hadamard gates to form a sequence of alternating Hadamard-free Clifford-Hadamard pairs circuit to form the randomized benchmarking protocol, at 106. The method also includes measuring noise in a quantum mechanical processor using the randomized benchmarking protocol, at 108.

In an embodiment, randomly generating the uniformly distributed linear Boolean invertible matrix of conditional NOT (CNOT) gate includes randomly generating a uniformly distributed linear Boolean invertible matrix (a circuit with the CNOT gates).

In an embodiment, combining each of the generated plurality of Hadamard-free Clifford circuits with corresponding each of the randomly generated plurality of Hadamard gates to form a sequence of alternating Hadamard-free Clifford-Hadamard pairs circuit to form the randomized benchmarking protocol includes alternating stages of Hadamard layers and Hadamard-free Clifford layers to form the modified randomized benchmarking protocol.

In an embodiment, generating randomly the plurality of Hadamard gates includes generating the plurality of Hadamard gates $H_1 \ldots _k$. Where k is an integer greater than 2 and corresponds to a number of random qubits sampled from n-qubits, n being greater than or equal to 2.

In an embodiment, generating randomly the plurality of Hadamard-free Clifford circuits (layers) includes generating the plurality of Hadamard-free Clifford circuits $F_1 \ldots _k$.

Where k is an integer greater than 2 and corresponds to a number of random qubits sampled from n-qubits, n being greater than or equal to 2.

In an embodiment, combining each of the generated plurality of Hadamard-free Clifford circuits with corresponding each of the randomly generated plurality of Hadamard gates to form the sequence of alternating Hadamard-free Clifford-Hadamard pairs circuit includes forming the sequence $F_1 H_1 \ldots F_k H_k F_{k+1} H_{k+1}$, where k is an integer.

In an embodiment, the plurality of Hadamard-free Clifford circuits are different from each other and are chosen at random according to a specified distribution.

In an embodiment, generating each of the plurality of Hadamard-free Clifford circuits includes randomly generating the uniformly distributed phase (P) gate, randomly generating the uniformly distributed linear Boolean invertible matrix of conditional NOT (CNOT) gate, and randomly generating a uniformly distributed conditional rotation around axis-Z (CZ) gate, and combining the P, CZ, and CNOT gates to form each of the plurality of Hadamard-free Clifford circuits.

In an embodiment, combining each of the generated plurality of Hadamard-free Clifford circuits with corresponding each of the randomly generated plurality of Hadamard gates to form a sequence of alternating Hadamard-free Clifford-Hadamard pairs circuit includes forming the sequence $F_1 H_1 \ldots F_k H_k F_{k+1} H_{k+1}$, where k is an integer. The Hadamard-free Clifford circuits $F_1, F_2, \ldots, F_k$ are equal to a product P·CZ·CNOT, where P is a uniformly distributed phase (P) gate, CZ is a uniformly distributed conditional rotation around axis-Z (CZ) gate, and CNOT is a uniformly distributed linear Boolean conditional NOT (CNOT) circuit. The Hadamard-free Clifford circuit $F_{k+1}$ is reduced to contain no more than nk−k(k+1)/2 two-qubit CNOT and CZ gates. Where k is the number of Hadamard gates in Bruhat expansion of $F_1 H_1 \ldots F_k H_k$, where nk−k(k+1)/2 is obtained by reducing a left-hand Hadamard-free element by commuting and merging gates in it to the right.

In an embodiment, a computational complexity of generating the randomized benchmarking protocol grows quadratically with a number of qubits.

In an embodiment, measuring the noise in the quantum mechanical circuit includes combining an additional Hadamard-free Clifford-Hadamard pair to the formed sequence of Hadamard-free Clifford-Hadamard pairs circuit to perform an inversion of a unitary transformation obtained by the formed sequence of Hadamard-free Clifford-Hadamard pairs circuit.

In an embodiment, the method also includes optimizing a length of the randomized benchmarking protocol by using fewer gates in the plurality of Hadamard-free Clifford circuits than a number of circuit elements in a full Clifford circuit.

In an embodiment, elements of the plurality of Hadamard-free Clifford circuits are computed using the following equation:

$$|\mathcal{F}(n)| = 2^{2n+n^2} \prod_{j=1}^{n} (2^j - 1)$$

and the number of circuit elements in the full Clifford circuit is computed using the following equation:

$$|C(n)| = 2^{2n+n^2} \prod_{j=1}^{n} (4^j - 1)$$

where n is a number of qubits, j is an independent variable and j is an increment from 1 to n number of qubits.

In an embodiment, generating the uniformly distributed linear Boolean invertible conditional NOT (CNOT) gate includes generating a lower triangular random matrix (A) having random qubits 0 and/or 1; generating an upper triangular random matrix (T) having random qubits 0 and/or 1; and multiplying the lower triangular random matrix (A) and the upper triangular random matrix (T) to generate the uniformly distributed linear Boolean invertible (CNOT) gate (CNOT=A·T).

In an embodiment, the uniformly distributed linear Boolean invertible (CNOT) gate can be generated by implementing the following Python code, for example.

```
import numpy as np
n = 3                                   # matrix size
A = np.random.randint(2, size=(n, n))
T = np.zeros((n,n),dtype=int)
rows = list(range(n))
print ('rows =', rows)
print ("")
for j in range(n-1):
    v = np.random.randint(2,size=(1,n-j))    # pick random uniform nonzero n-bit string
    while np.count_nonzero(v)==0:
        v = np.random.randint(2,size=(1,n-j))
    r = np.nonzero(v)[1][0]                  # let r be the first nonzero element of v
    A[j,rows] = 0; A[j,rows[r]] = 1          # assign values to A
    for i in range(n-j):                     # assign values to T
        T[rows[r],rows[i]] = v[0,i]
    del rows[r]
A[n-1,rows[0]] = 1
T[rows[0],rows[0]] = 1
U = np.matmul(A,T) % 2                       # compute the random uniform invertible matrix
print(U)
```

Another aspect of the present invention is to provide a computer readable medium on which is stored non-transitory computer-executable code, which when executed by a classical computer causes a quantum computer to:

1) provide randomly a plurality of Hadamard gates;
2) apply the randomly generated Hadamard gates to a plurality of qubits;
3) generate randomly a plurality of Hadamard-free Clifford circuits, wherein each of the plurality of Hadamard-free Clifford circuits is generated by at least randomly generating a uniformly distributed phase (P) gate, and randomly generating a uniformly distributed linear Boolean invertible matrix of conditional NOT (CNOT) gate, and combining the P and CNOT gates to form each of the plurality of Hadamard-free Clifford circuits;
4) combine each of the generated plurality of Hadamard-free Clifford circuits with corresponding each of the randomly generated plurality of Hadamard gates to form a sequence of alternating Hadamard-free Clifford-Hadamard pairs circuit to form the randomized benchmarking protocol; and
5) measure noise in a quantum mechanical processor using the randomized benchmarking protocol.

In an embodiment, the non-transitory computer-executable code when executed by the classical computer causes the quantum computer to generate the plurality of Hadamard gates $H_1 \ldots k$, where k is an integer greater than 2 and corresponds to a number of random qubits sampled from n-qubits, n being greater than or equal to 2.

In an embodiment, the non-transitory computer-executable code when executed by the classical computer causes the quantum computer to generate the plurality of Hadamard-free Clifford circuits $F_1 \ldots k$, where k is an integer greater than 2 and corresponds to a number of random qubits sampled from n-qubits, n being greater than or equal to 2.

In an embodiment, the non-transitory computer-executable code when executed by the classical computer causes the quantum computer to combine each of the generated plurality of Hadamard-free Clifford circuits with corresponding each of the randomly generated plurality of Hadamard gates to form the sequence $F_1 H_1 \ldots F_k H_k F_{k+1} H_{k+1}$, where k is an integer.

In an embodiment, the plurality of Hadamard-free Clifford circuits are different from each other and are chosen at random according to a specified distribution.

In an embodiment, the non-transitory computer-executable code when executed by the classical computer causes the quantum computer to apply the uniformly distributed phase (P) gate, apply the uniformly distributed linear Boolean invertible matrix of conditional NOT (CNOT) gate, and apply a uniformly distributed conditional rotation around axis-Z (CZ) gate, and combine the P, CZ, and CNOT gates to form each of the plurality of Hadamard-free Clifford circuits.

In an embodiment, the non-transitory computer-executable code when executed by the classical computer causes the quantum computer to optimize a length of the randomized benchmarking protocol by using fewer gates in the plurality of Hadamard-free Clifford circuits than a number of circuit elements in a full Clifford circuit.

In an embodiment, elements of the plurality of Hadamard-free Clifford circuits are computed using the following equation:

$$|\mathcal{F}(n)| = 2^{2n+n^2} \prod_{j=1}^{n} (2^j - 1)$$

and the number of circuit elements in the full Clifford circuit is computed using the following equation:

$$|C(n)| = 2^{2n+n^2} \prod_{j=1}^{n}(4^j - 1)$$

where n is a number of qubits, j is an independent variable and j is an increment from 1 to n number of qubits.

In an embodiment, to synthesize a random element of group F, take random Boolean 2n-tuple to set Phase (P) gates, n(n−1)/2 random Boolean values to set CZ gates, and use Randall's algorithm to synthesize random invertible Boolean matrix using $n^2+O(1)$ random bits and computational complexity $O(n^{2.373})$. When a circuit representation suffices, the complexity decreases to $O(n^2)$. The random Clifford unitary generation uses $2n^2+O(n)$ random bits, whereas the present method uses $1.5n^2+O(n)$ random bits. In an embodiment, a computational complexity of the present method is $O(n^{2.373})$ or $O(n^2)$, depending on the desired data structure, whereas a computational complexity of a conventional method is $O(n^3)$.

In an embodiment, the present method returns data structures (phase polynomial, or circuit) that can be more useful in the context of RB than the symplectic matrices used in conventional methods. Furthermore, in an embodiment, the present method uses fewer random bits (by a factor ¾), which is calculated by dividing $1.5n^2+O(n)$ random bits by $2n^2+O(n)$ random bits. In addition, the computational complexity of the present method is significantly lower.

Figure 2:
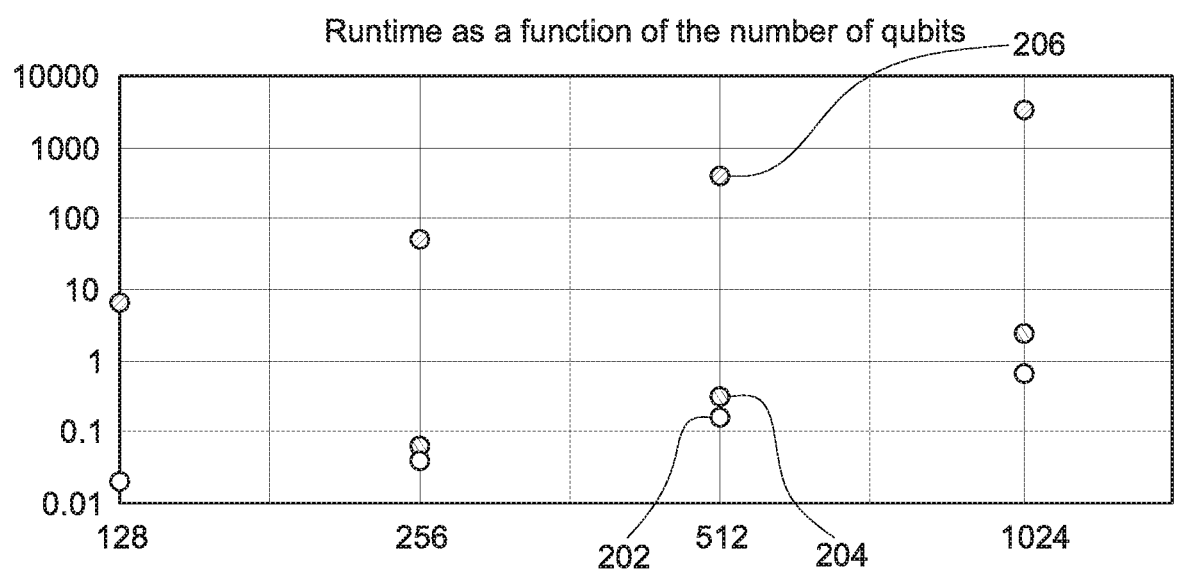
FIG. 2 is a plot showing a comparison between a runtime of the present method of generating a randomized benchmarking protocol and a runtime of a conventional method of generating a randomized benchmarking protocol as a function of a number of qubits, according to an embodiment of the present invention.

FIG. 2 is a plot showing a comparison between a runtime of the present method of generating a randomized benchmarking protocol and a runtime of a conventional method of generating a randomized benchmarking protocol as a function of a number of qubits, according to an embodiment of the present invention. The horizontal axis corresponds to the number of qubits and the vertical axis corresponds to the runtime. Dots 202 in the plot correspond to the runtime of a first method requiring that the Clifford unitary be generated in the form P·CZ·CNOT. It is noted that the complexity of the implementation scales cubically in n (this said, it can be improved to $O(n^{2.3729})$ with the use of advanced matrix multiplication algorithms), but is still a lot more efficient than dots 206, showing the state of the art, per Koenig and Smolin. Dots 204 correspond to the runtime in the scenario when the answer can be given in a circuit or phase polynomial form using a second method according to an embodiment of the present invention. The complexity of generating dots 202 is quadratic. As such, for larger n, (not shown) the gap in efficiency of 202 (the first method) compared to 204 (the second method) will continue widening, with 202 (the first method) being more efficient. Dots 206 in the plot correspond to the runtime of a conventional method (Koenig-Smolin method) of generating the Clifford unitary circuit. As it is clearly shown in this plot, the runtime of the first and second methods (dots 202 and dots 204, respectively) of generating the random Clifford unitary circuit according to embodiments of the present invention is about 1000-fold lower that the runtime of the conventional method of generating the random Clifford unitary circuit. Therefore, the method(s) of a method of generating a randomized benchmarking protocol according to embodiments of the present invention is generally faster than conventional methods of generating a randomized benchmarking protocol.

As it can be appreciated from the above paragraphs, another aspect of the present invention is to provide a classical computer configured to execute a non-transitory computer-executable code, the code when executed by the classical computer causes a quantum computer to:

1) provide a randomly generated plurality of Hadamard gates;
2) apply the randomly generated Hadamard gates to a plurality of qubits;
3) generate randomly a plurality of Hadamard-free Clifford circuits, wherein each of the plurality of Hadamard-free Clifford circuits is generated by at least randomly generate a uniformly distributed phase (P) gate, and randomly generating a uniformly distributed linear Boolean invertible matrix of conditional NOT (CNOT) gate, and combining the P and CNOT gates to form each of the plurality of Hadamard-free Clifford circuits;
4) combine each of the generated plurality of Hadamard-free Clifford circuits with corresponding each of the randomly generated plurality of Hadamard gates to form a sequence of alternating Hadamard-free Clifford-Hadamard pairs circuit to form the randomized benchmarking protocol; and
5) measure noise in a quantum mechanical processor using the randomized benchmarking protocol.

In an embodiment, the code may be stored in a computer program product which include a computer readable medium or storage medium or media. Examples of suitable storage medium or media include any type of disk including floppy disks, optical disks, DVDs, CD ROMs, magnetic optical disks, RAMs, EPROMs, EEPROMs, magnetic or optical cards, hard disk, flash card (e.g., a USB flash card), PCMCIA memory card, smart card, or other media. In another embodiment, the code can be downloaded from a remote conventional or classical computer or server via a network such as the internet, an ATM network, a wide area network (WAN) or a local area network. In yet another embodiment, the code can reside in the "cloud" on a server platform, for example. In some embodiments, the code can be embodied as program products in the conventional or classical computer such as a personal computer or server or in a distributed computing environment including a plurality of computers that interacts with the quantum computer by sending instructions to and receiving data from the quantum computer.

Generally, the classical or conventional computer provides inputs and receives outputs from the quantum computer. The inputs may include instructions included as part of the code. The outputs may include quantum data results of a computation of the code on the quantum computer.

The classical computer interfaces with the quantum computer via a quantum computer input interface and a quantum computer output interface. The classical computer sends commands or instructions included within the code to the quantum computer system via the input and the quantum computer returns outputs of the quantum computation of the code to the classical computer via the output. The classical computer can communicate with the quantum computer wirelessly or via the internet. In an embodiment, the quantum computer can be a quantum computer simulator simulated on a classical computer. For example, the quantum computer simulating the quantum computing simulator can be one and the same as the classical computer. In another embodiment, the quantum computer is a superconducting quantum computer. In an embodiment, the superconducting quantum computer includes one or more quantum circuits (Q chips), each quantum circuit comprises a plurality of qubits, one or more quantum gates, measurement devices, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of generating a randomized benchmarking protocol comprising:
providing a randomly generated plurality of Hadamard gates;
generating randomly a plurality of Hadamard-free Clifford circuits comprising a phase (P) gate and conditional NOT (CNOT) gate;
combining each of the generated plurality of Hadamard-free Clifford circuits with corresponding each of the randomly generated plurality of Hadamard gates to form a sequence of alternating Hadamard-free Clifford-Hadamard pairs circuit to form the randomized benchmarking protocol; and
measuring noise in a quantum mechanical processor using the randomized benchmarking protocol.

2. The method according to claim 1, wherein generating randomly the plurality of Hadamard gates comprises generating the plurality of Hadamard gates $H_{1 \ldots k}$, where k is an integer greater than 2 and corresponds to a number of random qubits sampled from n-qubits, n being greater than or equal to 2.

3. The method according to claim 1, wherein generating randomly the plurality of Hadamard-free Clifford circuits comprises generating the plurality of Hadamard-free Clifford circuits $F_{1 \ldots k}$, where k is an integer greater than 2 and corresponds to a number of random qubits sampled from n-qubits, n being greater than or equal to 2.

4. The method according to claim 1, wherein combining each of the generated plurality of Hadamard-free Clifford circuits with corresponding each of the randomly generated plurality of Hadamard gates to form the sequence of alternating Hadamard-free Clifford-Hadamard pairs circuit comprises forming the sequence $F_1 H_1 \ldots F_k H_k F_{k+1} H_{k+1}$, where k is an integer.

5. The method according to claim 1, wherein the plurality of Hadamard-free Clifford circuits are different from each other and are chosen at random according to a specified distribution.

6. The method according to claim 1, wherein generating each of the plurality of Hadamard-free Clifford circuits comprises randomly generating the uniformly distributed phase (P) gate, randomly generating the uniformly distributed linear Boolean invertible matrix of conditional NOT (CNOT) gate, and randomly generating a uniformly distributed conditional rotation around axis-Z (CZ) gate, and combining the P, CZ, and CNOT gates to form each of the plurality of Hadamard-free Clifford circuits.

7. The method according to claim 1, wherein combining each of the generated plurality of Hadamard-free Clifford circuits with corresponding each of the randomly generated plurality of Hadamard gates to form a sequence of Hadamard-free Clifford-Hadamard pairs circuit comprises forming the sequence $F_1 H_1 \ldots F_k H_k F_{k+1} H_{k+1}$, where k is an integer, wherein:
the Hadamard-free Clifford circuits $F_1, F_2, \ldots, F_k$ are equal to a product P·CZ·CNOT, where P is a uniformly distributed phase (P) gate, CZ is a uniformly distributed conditional rotation around axis-Z (CZ) gate, and CNOT is a uniformly distributed linear Boolean conditional NOT (CNOT) circuit, and
the Hadamard-free Clifford circuit $F_{k+1}$ is reduced to contain no more than $nk-k(k+1)/2$ two-qubit CNOT and CZ gates, where k is the number of Hadamard gates in Bruhat expansion of $F_1 H_1 \ldots F_k H_k$, where $nk-k(k+1)/2$ is obtained by reducing a left-hand Hadamard-free element by commuting and merging gates in it to the right.

8. The method according to claim 1, wherein a computational complexity of generating the randomized benchmarking protocol grows quadratically with a number of qubits.

9. The method according to claim 1, wherein measuring the noise in the quantum mechanical circuit comprises combining an additional Hadamard-free Clifford-Hadamard pair to the formed sequence of Hadamard-free Clifford-Hadamard pairs circuit to perform an inversion of a unitary transformation obtained by the formed sequence of Hadamard-free Clifford-Hadamard pairs circuit.

10. The method according to claim 1, further comprising optimizing a length of the randomized benchmarking protocol by using fewer gates in the plurality of Hadamard-free Clifford circuits than a number of circuit elements in a full Clifford circuit.

11. The method according to claim 10, wherein a size of the plurality of Hadamard-free Clifford circuits are computed using the following equation:

$$|\mathcal{F}(n)| = 2^{2n+n^2} \prod_{j=1}^{n} (2^j - 1)$$

and the number of circuit elements in the full Clifford circuit is computed using the following equation:

$$|C(n)| = 2^{2n+n^2} \prod_{j=1}^{n} (4^j - 1)$$

where n is a number of qubits, j is an independent variable and j is an increment from 1 to n number of qubits.

12. A computer readable medium on which is stored non-transitory computer-executable code, which when executed by a classical computer causes a quantum computer to:
provide a randomly generated plurality of Hadamard gates;
generate randomly a plurality of Hadamard-free Clifford circuits comprising a phase (P) gate and conditional NOT (CNOT) gate;
combine each of the generated plurality of Hadamard-free Clifford circuits with corresponding each of the randomly generated plurality of Hadamard gates to form a sequence of alternating Hadamard-free Clifford-Hadamard pairs circuit to form the randomized benchmarking protocol; and
measure noise in a quantum mechanical processor using the randomized benchmarking protocol.

13. The computer readable medium according to claim 12, wherein the non-transitory computer-executable code when executed by the classical computer causes the quantum computer to generate the plurality of Hadamard gates $H_1 \ldots _k$, where k is an integer greater than 2 and corresponds to a number of random qubits sampled from n-qubits, n being greater than or equal to 2.

14. The computer readable medium according to claim 12, wherein the non-transitory computer-executable code when executed by the classical computer causes the quantum computer to generate the plurality of Hadamard-free Clifford circuits $F_1 \ldots _k$, where k is an integer greater than 2 and corresponds to a number of random qubits sampled from n-qubits, n being greater than or equal to 2.

15. The computer readable medium according to claim 12, wherein the non-transitory computer-executable code when executed by the classical computer causes the quantum computer to combine each of the generated plurality of Hadamard-free Clifford circuits with corresponding each of the randomly generated plurality of Hadamard gates to form the sequence $F_1 H_1 \ldots F_k H_k F_{k+1} H_{k+1}$, where k is an integer.

16. The method according to claim 12, wherein the plurality of Hadamard-free Clifford circuits are different from each other and are chosen at random according to a specified distribution.

17. The computer readable medium according to claim 12, wherein the non-transitory computer-executable code when executed by the classical computer causes the quantum computer to apply the uniformly distributed phase (P) gates, apply the uniformly distributed random linear Boolean invertible matrix computed by conditional NOT (CNOT) gates, and apply a random uniformly distributed conditional rotation around axis-Z (CZ) gate, and combine the P, CZ, and CNOT gates to form each of the plurality of Hadamard-free Clifford circuits.

18. The computer readable medium according to claim 12, wherein the non-transitory computer-executable code when executed by the classical computer causes the quantum computer to optimize a length of the randomized benchmarking protocol by using fewer gates in the plurality of Hadamard-free Clifford circuits than a number of circuit elements in a full Clifford circuit.

19. The computer readable medium according to claim 18, wherein the number of elements of the plurality of Hadamard-free Clifford circuits are computed using the following equation:

$$|\mathcal{F}(n)| = 2^{2n+n^2} \prod_{j=1}^{n} (2^j - 1)$$

and the number of circuit elements in the full Clifford circuit is computed using the following equation:

$$|C(n)| = 2^{2n+n^2} \prod_{j=1}^{n} (4^j - 1)$$

where n is a number of qubits, j is an independent variable and j is an increment from 1 to n number of qubits.

20. A classical computer configured to execute a non-transitory computer-executable code, the code when executed by the classical computer causes a quantum computer to:

provide randomly a plurality of Hadamard gates;

generate randomly a plurality of Hadamard-free Clifford circuits comprising a phase (P) gate and conditional NOT (CNOT) gate;

combine each of the generated plurality of Hadamard-free Clifford circuits with corresponding each of the randomly generated plurality of Hadamard gates to form a sequence of alternating Hadamard-free Clifford-Hadamard pairs circuit to form the randomized benchmarking protocol; and measure noise in a quantum mechanical processor using the randomized benchmarking protocol.

* * * * *